United States Patent
Pang et al.

(10) Patent No.: US 10,923,603 B2
(45) Date of Patent: Feb. 16, 2021

(54) SEMICONDUCTOR DEVICE COMPRISING SCHOTTKY BARRIER DIODES

(71) Applicant: KEY FOUNDRY CO., LTD., Cheongju-si (KR)

(72) Inventors: Yon Sup Pang, Cheonan-si (KR); Hyun Kwang Shin, Cheongju-si (KR); Tae Hoon Lee, Sejong-si (KR)

(73) Assignee: Key Foundry Co., Ltd., Cheongju-si (KR)

( * ) Notice: Subject to any disclaimer, the term of this patent is extended or adjusted under 35 U.S.C. 154(b) by 0 days.

(21) Appl. No.: 16/702,647

(22) Filed: Dec. 4, 2019

(65) Prior Publication Data
US 2020/0105947 A1 Apr. 2, 2020

Related U.S. Application Data

(62) Division of application No. 15/992,515, filed on May 30, 2018, now Pat. No. 10,566,465.

(30) Foreign Application Priority Data

Sep. 29, 2017 (KR) ........................ 10-2017-0127852

(51) Int. Cl.
*H01L 29/872* (2006.01)
*H01L 29/10* (2006.01)
*H01L 29/40* (2006.01)
*H01L 29/06* (2006.01)
*H01L 21/76* (2006.01)
*H01L 29/36* (2006.01)
*H01L 21/762* (2006.01)
*H01L 27/07* (2006.01)

(52) U.S. Cl.
CPC ............ *H01L 29/872* (2013.01); *H01L 21/76* (2013.01); *H01L 21/76224* (2013.01); *H01L 27/0727* (2013.01); *H01L 29/0619* (2013.01); *H01L 29/0649* (2013.01); *H01L 29/1079* (2013.01); *H01L 29/36* (2013.01); *H01L 29/402* (2013.01)

(58) Field of Classification Search
CPC ....... H01L 29/872; H01L 21/76; H01L 29/36; H01L 29/0619; H01L 21/76224; H01L 27/0727; H01L 29/0649
See application file for complete search history.

(56) References Cited

U.S. PATENT DOCUMENTS 9,525,077 B1 * 12/2016 Bi .................... H01L 27/0629
2006/0180892 A1 8/2006 Pardoen
(Continued)

*Primary Examiner* — Julia Slutsker
(74) *Attorney, Agent, or Firm* — NSIP Law

(57) ABSTRACT

A semiconductor device includes a first N-type deep well region and a second N-type deep well region formed in a substrate, an N-type diffused well region formed between the first N-type deep well region and the second N-type deep well region, wherein a concentration of the N-type diffused well region is less than a concentration of the first N-type deep well region or the second N-type deep well region, a first P-type well region formed in the first N-type deep well region, a second P-type well region formed in the N-type diffused well region, an insulating film formed to be in contact with the first P-type well region, and a silicide formed on the N-type diffused well region, such that a Schottky barrier diode is formed between the silicide and the N-type diffused well.

17 Claims, 7 Drawing Sheets

(56) References Cited

U.S. PATENT DOCUMENTS

| | | | |
|---|---|---|---|
| 2008/0135970 A1* | 6/2008 | Kim | H01L 29/872 257/471 |
| 2009/0236679 A1* | 9/2009 | Chiang | H01L 29/0649 257/483 |
| 2009/0294865 A1 | 12/2009 | Tang et al. | |
| 2011/0233713 A1 | 9/2011 | Son | |
| 2012/0086099 A1 | 4/2012 | Yeh et al. | |
| 2014/0070315 A1* | 3/2014 | Levy | H01L 27/0617 257/343 |
| 2016/0322262 A1* | 11/2016 | Li | H01L 21/761 |
| 2017/0077296 A1* | 3/2017 | Yang | H01L 29/063 |
| 2018/0190493 A1* | 7/2018 | Kumar | H01L 29/66143 |

* cited by examiner

SEMICONDUCTOR DEVICE COMPRISING SCHOTTKY BARRIER DIODES

CROSS-REFERENCE TO RELATED APPLICATIONS

This application is a division of U.S. patent application Ser. No. 15/992,515 filed on May 30, 2018, which claims the benefit under 35 U.S.C. 119(a) of Korean Patent Application No. 10-2017-0127852 filed on Sep. 29, 2017 in the Korean Intellectual Property Office, the entire disclosure of which is incorporated herein by reference for all purposes.

BACKGROUND

1. Field

The following description relates to a semiconductor device including Schottky barrier diodes that increase a breakdown voltage and reduce a leakage current in bipolar-CMOS-DMOS (BCD) technology applications.

2. Description of Related Art

Schottky diodes are used as switching or rectifying devices in semiconductor integrated circuits. The metal-semiconductor junction of a Schottky barrier diode enables faster switching than general P-N junction diodes. Thus, semiconductor devices including Schottky barrier diodes are used for high-performance switching applications. Recently, Schottky diodes have been integrated into bipolar-CMOS-DMOS (BCD) technology, where CMOS technology is complementary metal-oxide semiconductor technology and DMOS technology is double-diffused metal-oxide semiconductor technology.

When a forward bias voltage is applied to a Schottky diode, the minority carrier injection (MCI) phenomenon of a P-N junction diode does not occur. Thus, Schottky diodes are able to switch faster than a P-N junction diodes because Schottky diodes are characterized by the feature that a current flows not by minority carriers but by majority carriers, and accordingly there is no storage effect resulting from the method of operation, so the Schottky diodes have an advantage of a very short reverse recovery time. In addition, Schottky diodes have a lower turn-on voltage than do P-N junction diodes.

However, the breakdown voltage of Schottky diodes may be lower than the breakdown voltage of P-N junction diodes. Recent BCD applications, such as DC-DC converters, and so on, use applications that use the high breakdown voltage and the low leakage current of Schottky diodes.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor device includes a first N-type deep well region and a second N-type deep well region formed in a substrate, an N-type diffused well region formed between the first N-type deep well region and the second N-type deep well region, wherein a concentration of the N-type diffused well region is less than a concentration of the first N-type deep well region or the second N-type deep well region, a first P-type well region formed in the first N-type deep well region, a second P-type well region formed in the N-type diffused well region, an insulating film formed to be in contact with the first P-type well region, and a silicide formed on the N-type diffused well region, such that a Schottky barrier diode is formed between the silicide and the N-type diffused well region.

The semiconductor device may further include a P-type highly-doped first region formed in the first P-type well region, and a P-type highly-doped second region formed in the second P-type well region.

The semiconductor device may further include an N-type buried layer formed below the N-type diffused well region, and a concentration of the N-type buried layer may be greater than a concentration of the N-type diffused well region.

The silicide may be further formed to be in contact with the first and second N-type deep well regions, the first P-type well region, and the second P-type well region.

The semiconductor device may further include an N-type well region formed in the first N-type deep well region, a cathode connected to the N-type well region, a poly field plate formed on the insulating film, and an anode connected to the poly field plate and the silicide.

In another general aspect, a semiconductor device includes an N-type deep well region formed in a substrate, P-type well regions formed in the N-type deep well region, a silicide layer formed on the N-type deep well region, such that a Schottky barrier diode is formed between the silicide and the N-type deep well region, an N-type well region formed in the N-type deep well region and separated from the P-type well region by an insulating film, and a deep trench isolation region having a greater depth than a depth of the N-type deep well region and surrounding the N-type deep well region.

The semiconductor device may further include an N-type buried layer formed below the N-type deep well region, wherein a depth of the N-type buried layer is less than a depth of the deep trench isolation region, and wherein a concentration of the N-type buried layer is greater than a concentration of the N-type deep well region.

The semiconductor device may further include a channel stop region formed under the deep trench isolation region.

The semiconductor device may further include a P-type highly-doped region formed in the P-type well region, and a poly field plate formed on the insulating film.

The semiconductor device may further include an N-type diffused well region formed between the P-type well regions, wherein a dopant concentration of the N-type deep well region is greater than a dopant concentration of the N-type diffused well region.

The N-type deep well region and the N-type diffused well region may be formed in an epitaxial layer that is formed in the substrate.

In another general aspect, a semiconductor device includes an N-type deep well region and an N-type diffused well region contacting the N-type deep well region formed in a substrate, wherein a concentration of the N-type diffused well region is less than a concentration of the N-type deep well region, a first P-type well region formed in the N-type deep well region, a second P-type well region formed in the N-type diffused well region, an insulating film formed to be in contact with the first P-type well region, and a silicide formed to be in contact with the N-type diffused well region, such that a Schottky barrier diode is formed between the silicide and the N-type diffused well region.

The semiconductor device may further include an N-type buried layer formed below the N-type deep well region, and a deep trench isolation region formed in the substrate.

A depth of the N-type buried layer may be less than a depth of the deep trench isolation region, and a concentration of the N-type buried layer may be greater than a concentration of the N-type diffused well region.

The semiconductor device may further include an N-type well region formed in the N-type deep well region and separated from the first P-type well region by the insulating film, a poly field plate formed on the insulating film, a cathode connected to the N-type well region, and an anode connected to the poly field plate and the silicide.

The silicide may be further formed to be in contact with the first P-type well region, the second P-type well region, and the insulating film.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
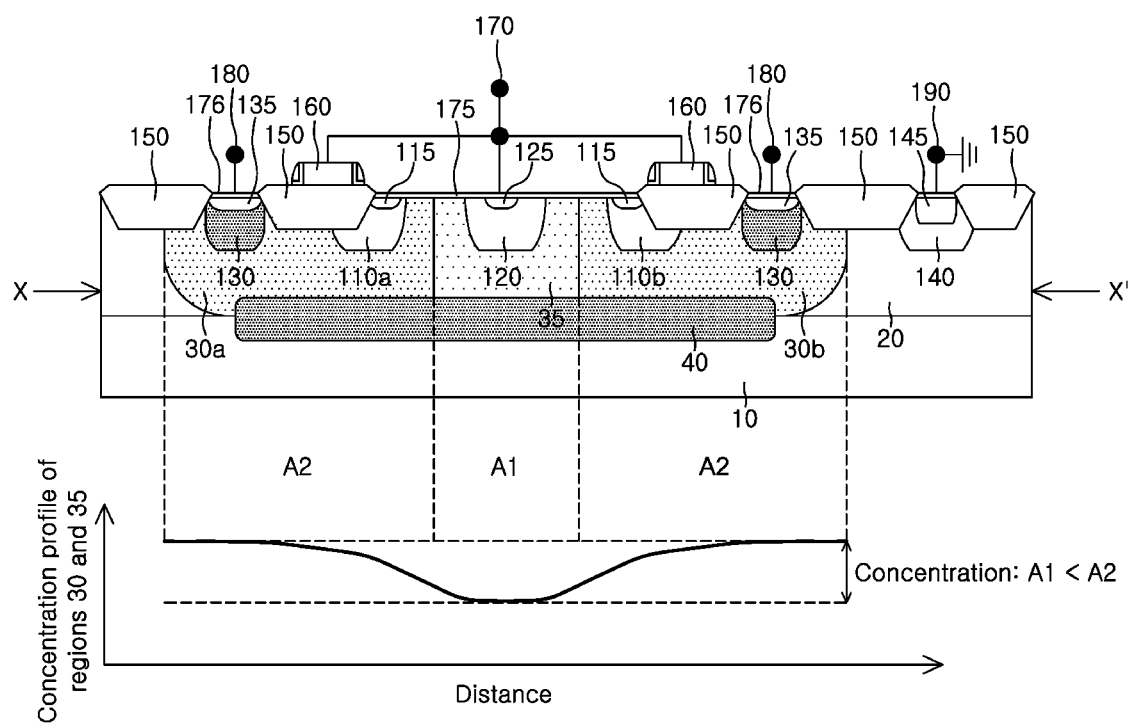
FIG. 1 is a cross-sectional view of an example of a semiconductor device including a Schottky barrier diode.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

Semiconductor devices including Schottky barrier diodes (SBD) proposed for these examples improve breakdown voltage, reduce leakage current, and are integrated within BCD technologies. In the SBD structures, a diffused well region located at the center of the device and surrounded by an N-type deep well improves breakdown voltage and reduces leakage current. Also, a poly field plate connected to an anode terminal of the SBD reduces lateral fields under shallow trench isolation (STI) or local oxidation of silicon (LOCOS) areas for reduced surface field (RESURF) effects. In consequence of this approach, examples may improve the breakdown voltage if design rules or dopant concentrations are optimized accordingly. Resistivity of an N-type buried layer located between a substrate and an N-type deep well is lower than that of the N-type deep well, and consequently the forward bias current of SBD with an N-type buried layer increases.

Examples provide a semiconductor device including a Schottky barrier diode that may increase breakdown voltage and also reduce leakage current.

More particularly, examples provide a semiconductor device including a Schottky barrier diode that may increase breakdown voltage and also reduce leakage current by using a diffused well region located at a center region of the Schottky barrier diode at which an ion implantation process for forming deep well regions is not applied.

Examples provide a semiconductor device including a Schottky barrier diode that may increase a forward bias current by using a buried layer whose resistance is lower than the resistance of a deep well region.

Examples provide a semiconductor device including a Schottky barrier diode that may reduce lateral fields that would otherwise occur underneath an STI insulating film or a LOCOS insulating film by using a poly field plate.

Examples provide a semiconductor device including a Schottky barrier diode that may increase breakdown voltage by applying an epitaxial process.

FIG. 1 is a diagram of an example of a semiconductor device including a Schottky barrier diode.

As illustrated in the example of FIG. 1, the example of the semiconductor device including a Schottky barrier diode includes a substrate 10, a first N-type deep well region 30a, a second N-type deep well region 30b, a P-type deep well region 20, an N-type diffused well region 35, an N-type buried layer 40, a first P-type well region 110a, a second P-type well region 120, a third P-type well region 110b, an N-type well region 130, a P-type fourth well region 140, an insulating film 150, a poly field plate 160, a silicide 175, an anode 170, and a cathode 180.

A Schottky barrier diode is formed between the silicide 175 and the first N-type deep well region 30a or the second N-type deep well region 30b. Also, Schottky barrier diode is formed between the silicide 175 and the N-type diffused well region 35. The first and second N-type deep well regions 30a and 30b and the P-type deep well region 20 are formed in the substrate 10. The N-type buried layer 40 is formed below the N-type deep well regions 30a and 30b or the diffused well region 35. In such an example, the concentration of the N-type buried layer 40 is higher than the concentration of the N-type deep well regions 30a and 30b. Also, a concentration of the N-type buried layer is greater than a concentration of the N-type diffused well region. Therefore, the forward bias current of the Schottky barrier diode with the N-type buried layer 40 is increased accordingly.

The N-type diffused well region 35 is formed so as to enclose the second P-type well region 120. Also, the N-type diffused well region 35 is formed between the first N-type deep well region 30a and the second N-type deep well region 30b. In other words, the first N-type deep well region 30a and the second N-type deep well region 30b are separated by the N-type diffused well region 35. Also, the concentration of the first N-type deep well region 30a or the second N-type deep well region 30b is higher than the concentration of the N-type diffused well region 35. Thus, the dopant concentration profile on the axis of X-X' with respect to the example of FIG. 1 gradually becomes lower from the first and second N-type deep well regions 30a and 30b on both sides, and the dopant concentration value is the lowest in the N-type diffused well region 35. The ion implantation process used for forming the first and second N-type deep well regions 30a and 30b are not applied to the N-type diffused well region 35. After a thermal process, the dopants of the first and second N-type deep well regions 30a and 30b are diffused into the N-type diffused well region 35. In such an example, the dopant concentration of the N-type diffused well region 35 is lower than the dopant concentration of the first N-type deep well region 30a or the second N-type deep well region 30b. Such a lower dopant concentration is used for increasing a breakdown voltage of the Schottky barrier diode and reducing the leakage current of the Schottky barrier diode. Accordingly, the second P-type well region 120 is formed in the N-type diffused well region 35.

The first and third P-type well regions 110a and 110b are formed in both sides of the second P-type well region 120. Also, the first and third P-type well regions 110 are formed in the first N-type deep well region 30a and the second N-type deep well region 30b, respectively. The first or third P-type well region 110a or 110b is formed to enclose a bottom corner region of the insulating film 150. Therefore, the first and third P-type well regions 110a and 110b increase the breakdown voltage of the Schottky barrier diode accordingly because as a result the high stress and electric field therefore concentrate at the bottom corner region of the insulating film 150, where the avalanche breakdown easily occurs. Therefore, when the first or third P-type well region 110a or 110b is formed to enclose the bottom corner region of the insulating film 150, there is a corresponding effect of decreasing the electric field. Thus, the breakdown voltage may be increased accordingly. Therefore, in an example, the depth of the first P-type well region is formed to be greater than the depth of the insulating film 150 to achieve such an effect.

Additionally, a P-type highly-doped first region 115 is formed in the first P-type well region 110. That is, the first P-type well as a whole includes a P+ doped region 115 and the P− doped region 110. The first P-type well region 110 increases the breakdown voltage of the Schottky barrier diode. Furthermore, a P-type highly-doped second region 125 is formed in the second P-type well region 120. That is, the second P-type well as a whole includes a P+ doped region 125 and the P− doped region 120. The second P-type well region 120 decreases the leakage current of the Schottky barrier diode, because the area where the silicide 175 meets the first and second N-type deep well regions 30a and 30b and the N-type diffused well region 35, that is, the undoped region before a thermal process, becomes smaller due to the presence of the second P-type well region 120. Therefore, the larger the width of the second P-type well region 120, the lower the leakage current in a reverse bias state and the lower the forward bias current, as well. Thus, in the semiconductor device including a Schottky barrier diode structure, the area in which the silicide metal material meets the silicon has a high electric field at a reverse bias condition, due to a large band bending phenomenon occurring near the silicon surface. For example, the second P-type well region 120 in contact with the silicide 175 serves as a buffer and reduces the high electric field at the N-type deep well region, and accordingly improves the breakdown voltage characteristics of the SBD.

The second P-type well region 120 is disposed at the center, and the first and third P-type well regions 110a and 110b are disposed to be symmetric with respect to both sides of the second P-type well region 120. In such an example, the first and second N-type deep well regions 30a and 30b and the N-type diffused well region 35 are under the first P-type well region 110a, the second P-type well region 120 and the third P-type well region 110b. As described above, the dopant concentration of the first N-type deep well region 30a or the second N-type deep well region 30b is higher than the concentration of the N-type diffused well region 35.

The insulating film 150 is formed to be in contact with the first P-type well region 110. For example, the insulating film 150 may be formed by a Shallow Trench Isolation (STI) or a Local Oxidation of Silicon (LOCOS) process, used for isolating elements or a reduced surface field (RESURF) phenomenon. In such an example, the insulating film 150 for RESURF is located between the N-type well region 130 and the first P-type well region 110. The N-type well regions 130 are formed in the N-type deep well regions 30a and 30b. A third N-type highly-doped region 135 is formed in the N-type well region 130. That is, the third N-type well includes the N+ region 135 and the N-type well region 130. Also, the P-type fourth well region 140 is formed in the P-type deep well region 20. The poly field plate 160 may also reduce lateral fields under STI or LOCOS, and in consequence may increase a breakdown voltage of the Schottky barrier diode if design rules or dopant concentrations are optimized to achieve such an effect.

The silicide 175 is formed to be in contact with the first and second N-type deep well regions 30a and 30b, the first P-type well region 110, the second P-type well region 120, and the insulating film 150. Thus, a Schottky barrier diode is formed between the silicide 175 and the first N-type deep well region 30a or the second N-type deep well region 30b. In examples, the silicides 175 and 176 may be a cobalt silicide or titanium silicide for the contact with an anode and cathode. However, these are only example materials and other materials with similar properties may be used for the silicides 175 and 176. The silicide 175 for the contact with the anode is disposed on the top surface of the active Schottky areas. That is, the silicide 175 is disposed on the N-type deep well regions 30a and 30b and the N-type diffused well region 35, on the top surface of the first and second P-type well regions 110 and 120, and on the top surface of the first and second P-type doped regions 115 and 125. In such an example, the anode 170 and the poly field plate 160 have the same electrical potential. The silicide 176 for the contact with the cathode is located on the top surface of the N-type well region 130 and the third N-type highly-doped region 135. In this example, the cathode 180 is in contact with the silicide 176.

Figure 2:
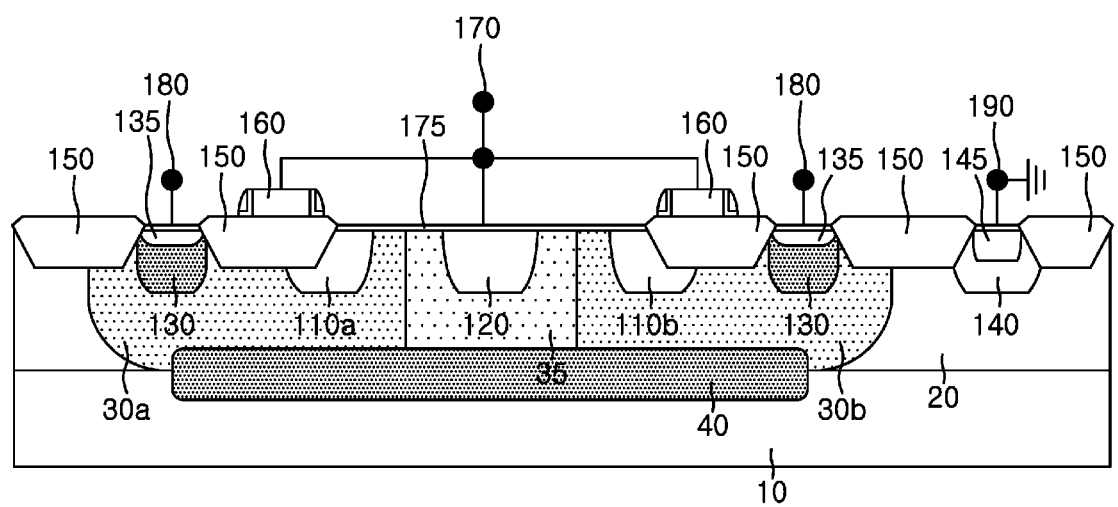
FIGS. 2 to 6 are cross-sectional views of other examples of the semiconductor device including a Schottky barrier diode.

FIG. 2 is a cross sectional view of another example of the semiconductor device comprising a Schottky barrier diode.

As illustrated in the example of FIG. 2, the P-type highly-doped first region 115 of the example of FIG. 1 is not formed in the first P-type well region 110. Thus, the first P-type well includes only the first P-type well region 110 without the P+ doped region 115. In addition, the P-type highly-doped second region 125 of FIG. 1 is not formed in the second P-type well region 120. Thus, the second P-type well includes only the second P-type well region 120, without the P+ doped region 125. Accordingly, in an example in which there is no P+ doped region, the electric field at the depletion region may decrease as well. Thus, the breakdown voltage may increase by comparison to the case where there is a P+ doped region. If the P+ doped region is replaced with a P-type well region, the impact ionization rate at the depletion region may decrease as well. Consequently, the breakdown voltage may increase.

The silicide 175 for the contact with the anode is located on the top surfaces of the active Schottky area and the first P-type well region 110 and second well region 120. In order to both increase the breakdown voltage of the Schottky barrier diode and decrease the leakage current, the ion implantation for the formation of the first N-type deep well region 30a and the second N-type deep well region 30b is not applied to the N-type diffused well region 35. Thus, in such an example, the dopants of the first and the second N-type deep well regions 30a and 30b are diffused into the N-type diffused well region 35 after a thermal process. Therefore, in such an example, the dopant concentration of the N-type diffused well region 35 is lower than the concentration of the first N-type deep well region 30a or the second N-type deep well region 30b. Likewise, the poly field plate 160 is formed on the insulating film 150, similar to the example of FIG. 1, and reduces lateral fields under a STI insulating film or LOCOS insulating film accordingly. Therefore, the poly field plate 160 may increase the breakdown voltage of the Schottky barrier diode if design rules or dopant concentrations are optimized appropriately.

Figure 3:
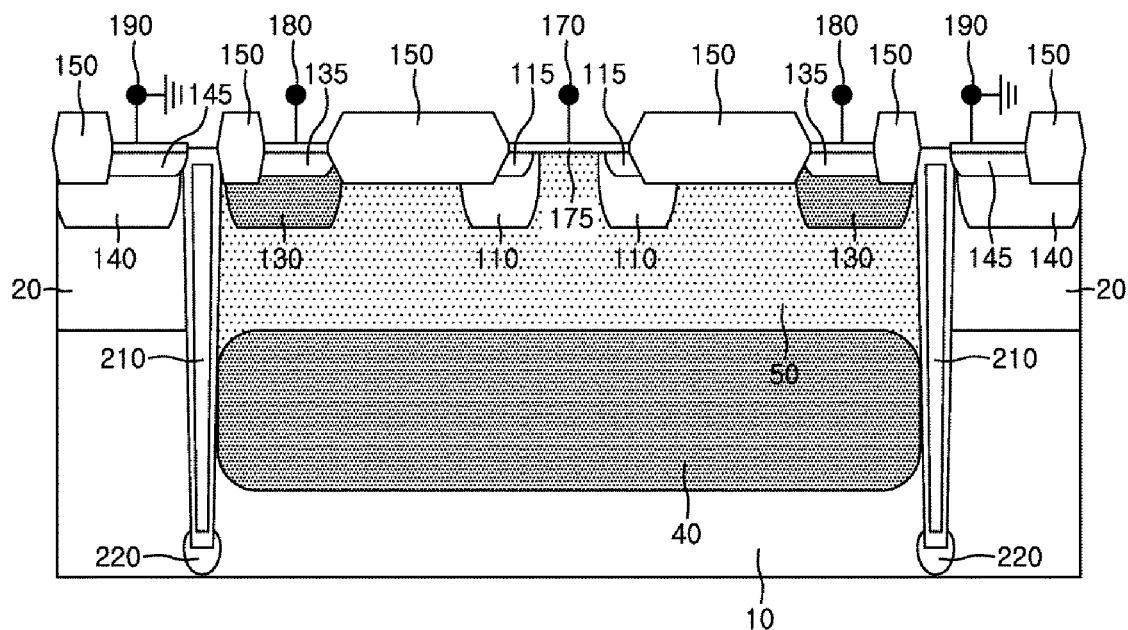

FIG. 3 is a cross-sectional view of another example of the Schottky barrier diode.

As illustrated in the example of FIG. 3, another example of the semiconductor device comprising a Schottky barrier diode includes a substrate 10, an N-type deep well region 50, a P-type deep well region 20, an N-type buried layer 40, a first P-type well region 110, a P-type highly-doped first region 115, an N-type well region 130, an insulating film 150, a silicide 175, an anode 170, a cathode 180, a deep trench isolation region 210, and a channel stop region 220.

The semiconductor device comprising a Schottky barrier diode of the example of FIG. 3 does not include the N-type diffused well region 35 and the second well region 120 of the examples of FIGS. 1 and 2. The semiconductor device comprising a Schottky barrier diode of the example of FIG. 3 includes the deep trench isolation region 210 and the channel stop region 220. For example, the deep trench isolation region 210 may be made of poly-silicon that is not doped. In such an example, the deep trench isolation region 210 separates the Schottky barrier diode from other devices. For example, the depth of the deep trench isolation region 210 is about 10-30 µm. The depth of the deep trench isolation region 210 is greater than the depth of each of the N-type deep well region 50, the P-type deep well region 20, the N-type buried layer 40, the first P-type well region 110, the P-type highly-doped first region 115, the N-type well region 130, and the insulating film 150. Furthermore, the depth of the N-type buried layer 40 is less than the depth of the deep trench isolation region 210. In addition, the deep trench isolation region 210 is formed so as to enclose the N-type deep well region 50.

Also, in such an example, the channel stop region 220 is formed under the deep trench isolation region 210. A general dopant used for forming the channel stop region 220 may be Boron Difluoride ($BF_2$). The channel stop region 220 prevents formation of a channel under the deep trench isolation region 210.

In the example of FIG. 3, the N-type deep well region 50 and the P-type deep well region 20 are formed in the substrate 10. The N-type buried layer 40 is formed below the N-type deep well region 50. In such an example, the resistance of the N-type buried layer 40 is lower than the resistance of the N-type deep well region 50, so the forward bias current of the Schottky barrier diode with the N-type buried layer 40 increases accordingly. The two P-type well regions 110 are formed in the N-type deep well region 50, wherein the two P-type well regions 110 are disposed spaced apart from each other. Also, a P-type highly doped region 115 is formed in each of the two P-type well regions 110. That is, the first P-type well includes a P+ doped region 115 and a P-type well region 110. Furthermore, the P-type well region 110 encloses a bottom corner region of the insulating film 150 and is formed accordingly. Therefore, as a result, the P-type well region 110 increases the breakdown voltage of the Schottky barrier diode. Such a result occurs because the bottom corner region of the insulating film 150 is a region on which the stress is concentrated and is a region where the electric field is formed to be high, and hence a breakdown voltage occurs easily. Therefore, when the P-type well region 110 is formed so as to enclose the bottom corner region of the insulating film 150, there is a corresponding effect of reducing the electric field, thereby increasing a breakdown voltage.

In the example of FIG. 3, the insulating film 150 is formed to be in contact with the P-type well region 110. For example, the insulating film 150 may be formed by an STI or a LOCOS process for isolating elements. The N-type well region 130 is formed to be separated from the insulating film 150 by the P-type well region 110. Furthermore, the insulating film 150 is formed to be in contact with the P-type well region 110. Another P-type well region 140 is formed in the P-type deep well region 20.

The silicide 175 is formed to be in contact with the N-type deep well region 50, the P-type well regions 110, and the insulating film 150. For example, the silicide 175 may be a cobalt silicide of a titanium silicide for anode contact, but alternative materials with appropriate, similar properties are used in other examples. In the example of FIG. 3, the silicide 175 for anode contact is located on the top surfaces of each of the active Schottky area, the P-type well region 110, and the P-type doped region 115. In such an example, the anode 170 is in contact with the silicide 175. Further, the cathode 180 is in contact with the silicide formed in a third N-type doped region 135.

Figure 4:
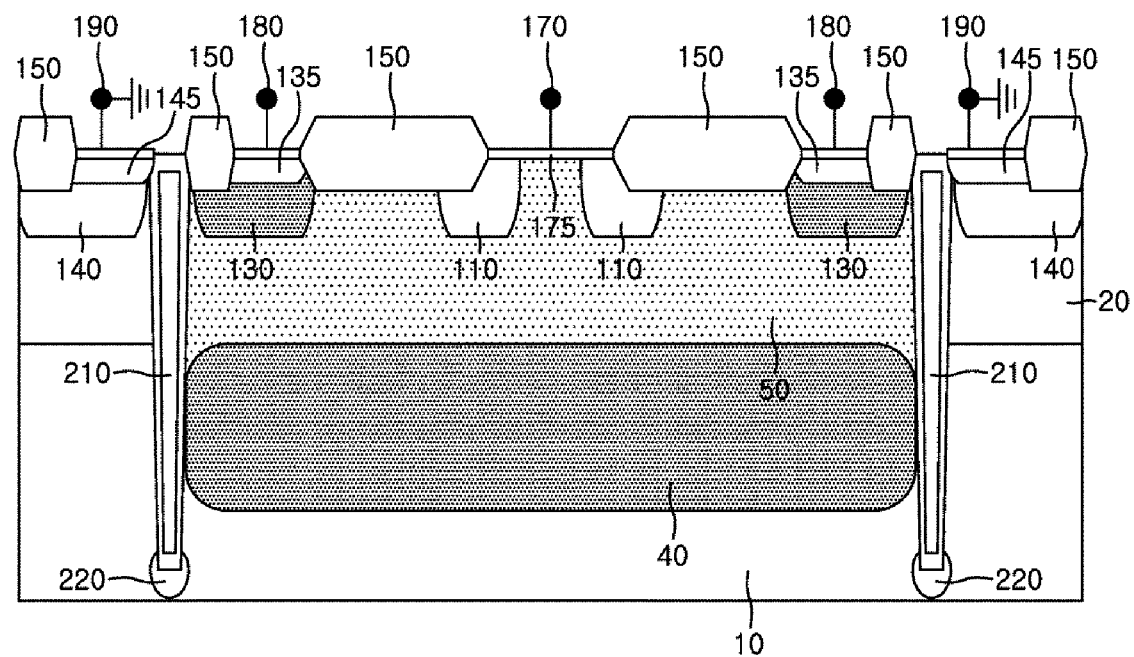

FIG. 4 is a cross-sectional view of another example of the Schottky barrier diode.

As illustrated in the example of FIG. 4, the P-type doped region 115 of the example of FIG. 3 is not formed in the P-type well region 110. For that reason, in the example in which there is no P+ doped region, the electric field may decrease. Thus, breakdown voltage increases, compared to the case in which there is a P+ doped region. When the silicide 175 meets the P+ doped region, an impact ionization rate increases with respect to a highly-doped region. If the P+ doped region is replaced with a P-type well region, the impact ionization rate decreases accordingly, and thus, the electric field decreases, as well. In consequence, the breakdown voltage also increases. In addition, similarly to the example of FIG. 3, the semiconductor device comprising a Schottky barrier diode of the example of FIG. 4 does not include the N-type diffusion deep well region 35 and the second P-type well region 120 of the examples of FIGS. 1 and 2.

Thus, the semiconductor device comprising a Schottky barrier diode includes a deep trench isolation region 210 and a channel stop region 220. The deep trench isolation region 210 separates the Schottky barrier diode from other devices. For example, the length of the deep trench isolation region 210 is about 10 to about 30 μm. The resistance of the N-type buried layer 40 is lower than the resistance of the N-type deep well region 50, so that the forward bias current of the Schottky barrier diode with the N-type buried layer 40 increases. The channel stop region 220 is formed under the deep trench isolation region 210. A general dopant for forming the channel stop region 220 may be $BF_2$, having the same conductivity type as the substrate. The channel stop region 220 prevents electrons from moving under the channel stop region 220.

Figure 5A:
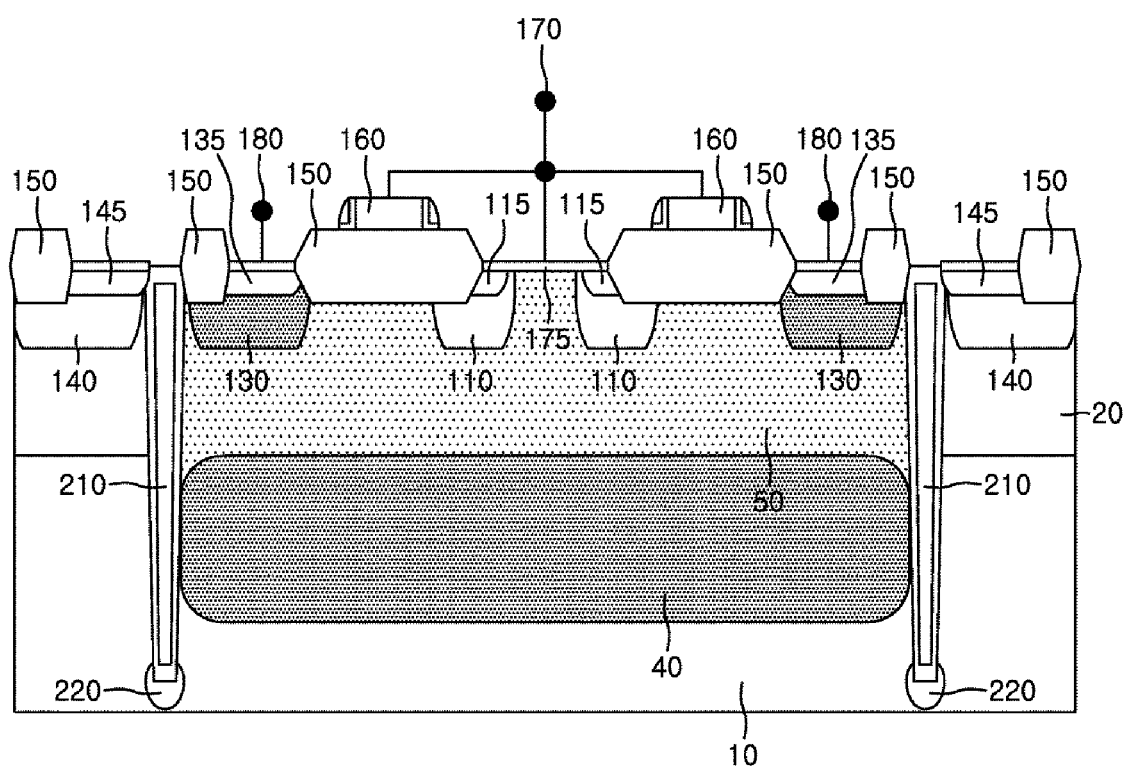
Figure 5B:
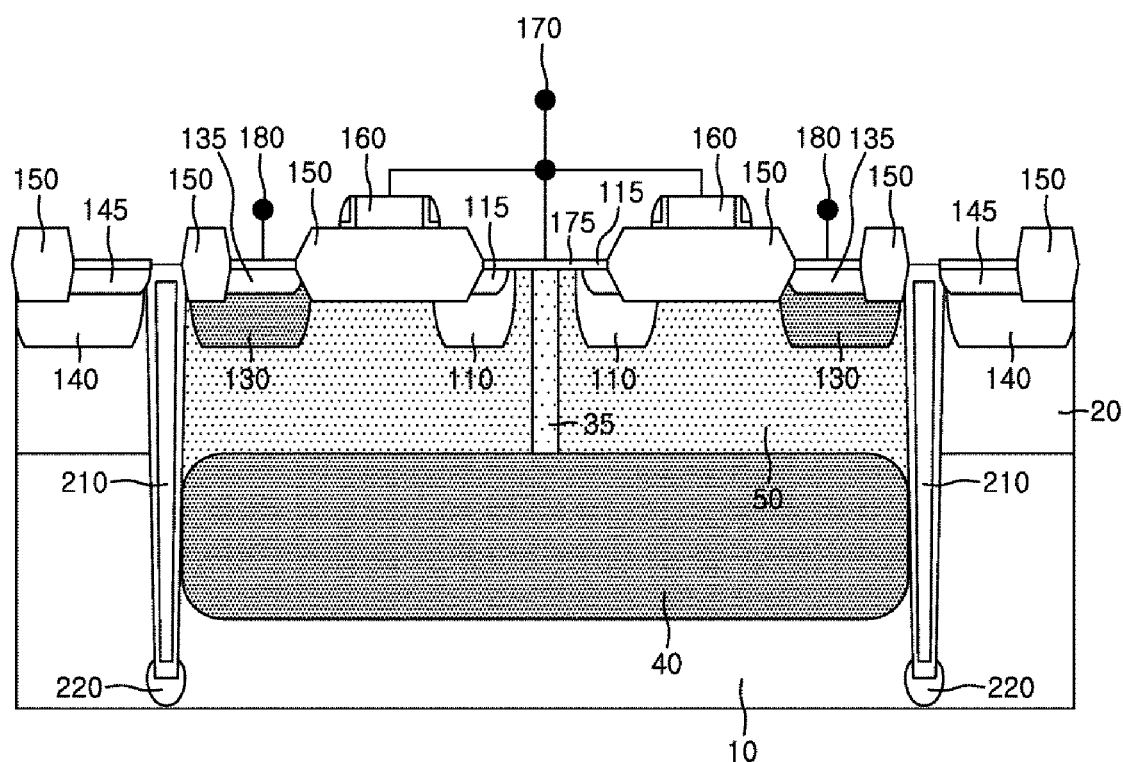

FIGS. 5A and 5B are cross-sectional views of another example of the semiconductor device comprising a Schottky barrier diode.

As illustrated in the example of FIG. 5A, the semiconductor device comprising a Schottky barrier diode further includes a poly field plate 160. The poly field plate 160 is formed, in the example of FIG. 5A, on a reduced surface field (RESURF) insulating film 150. In such an example, the anode 170 is connected to the poly field plate 160 and the silicide 175. The poly field plate 160 reduces the lateral fields under a STI insulating film or a LOCOS insulating film accordingly. Therefore, the poly field plate 160 may increase a breakdown voltage of the Schottky barrier diode, if design rules or dopant concentrations are optimized appropriately. The two P-type well regions 110 are formed in the N-type deep well region 50. The P-type doped region 115 is formed in the P-type well region 110. That is, in such an example, the P-type well region 110 includes a P+ region and a P-type well region. The P-type well region 110 increases a breakdown voltage of the Schottky barrier diode. The silicide 175 for anode contact is located on the N-type deep well region 50, the P-type well region 110, and the P-type doped region 115. The poly field plate 160 reduces lateral fields under a STI insulating film or a LOCOS insulating film accordingly. Therefore, the poly field plate 160 may increase a breakdown voltage of the Schottky barrier diode if design rules or dopant concentrations are optimized appropriately. The resistance of the N-type buried layer 40 is lower than the resistance of the N-type deep well region 50, so the forward bias current of the Schottky barrier diode with the N-type buried layer 40 increases as a result. If an epitaxial process is applied to the deep well region 50 in such an example, breakdown voltage may be increased by as much as 42%.

The semiconductor device comprising Schottky barrier diode of FIG. 5B further includes the N-type diffused well region 35 of FIG. 5A. The N-type diffusion deep well region 35 is formed between the first P-type well regions 110. The concentration of the N-type deep well region 50 is higher than the concentration of the N-type diffusion deep well region 35. The dopant concentration profile on the axis of X-X' gradually becomes lower from the N-type deep well region 50 on both sides, and the profile concentration value is the lowest in the N-type diffusion deep well region 35. The ion implantation for forming the N-type deep well region 50 is not applied to the N-type diffusion deep well region 35. The dopants of a deep well region 50 are diffused into the N-type diffusion deep well region 35 and such regions are formed accordingly. Therefore, the concentration of the N-type diffusion deep well region 35 is lower than that of the concentration of the deep well region 50, which provides for increasing breakdown voltage of the Schottky barrier diode and decreasing the leakage current, accordingly.

Figure 6:
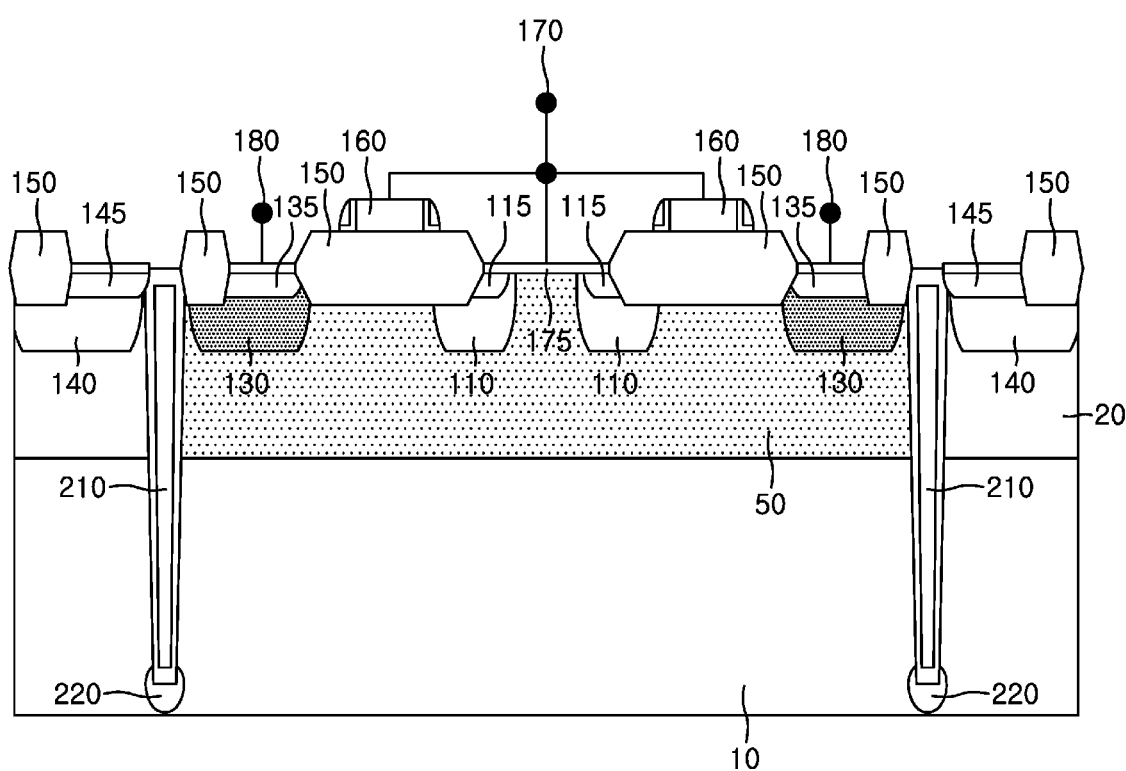

FIG. 6 is a cross sectional view of another example of the semiconductor device comprising a Schottky barrier diode.

As illustrated in the example of FIG. 6, the buried layer 40 of the examples of FIGS. 5A and 5B is not formed below the N-type deep well region 50. That is, in the example of FIG. 6, only the N-type deep well region 50 is formed in the P-type substrate 10. In such an example, the poly field plate 160 is formed on the RESURF insulating film 150. Furthermore, the anode 170 is connected to the poly field plate 160 and the silicide 175. The poly field plate 160 reduces the lateral fields under a STI insulating film or a LOCOS insulating film. Therefore, the poly field plate 160 may increase a breakdown voltage of the Schottky barrier diode if design rules or dopant concentrations are optimized accordingly. In the example of FIG. 6, the two P-type well regions 110 are formed in the deep well region 50. Subsequently, the P-type doped region 115 is formed in each of the two P-type well regions 110. That is, the P-type well region includes a P+ region and a P-type well region 110. The P-type well region 110 increases a breakdown voltage of the Schottky barrier diode. The silicide 175 for anode contact is located on the top surfaces of each of the active Schottky region, the P-type well region 110, and the P-type doped region 115. The poly field plate 160 reduces lateral fields accordingly under a STI insulating film or a LOCOS insulating film. Therefore, the poly field plate 160 may increase a breakdown voltage of the Schottky barrier diode if design rules or dopant concentrations are optimized appropriately. In the example of FIG. 6, if an epitaxial process is applied to the N-type deep well region 50, breakdown voltage may be increased by as much as 42%. If the epitaxial process is applied to the N-type deep well region 50, the N-type deep well region 50 may be regarded as an epitaxial layer in such an example.

Figure 7:
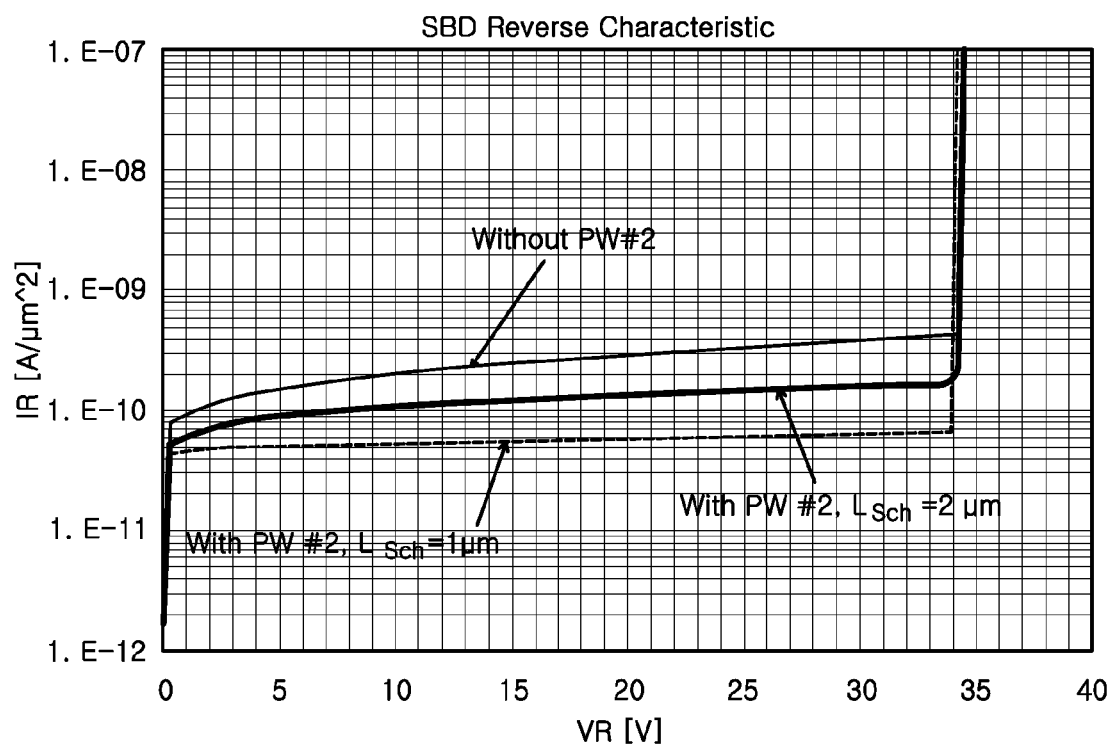
FIG. 7 shows a dependency of the reverse and forward characteristics of the example of the semiconductor device including a Schottky barrier diode in FIG. 1 on the space, $L_{sch}$, between the first P-type well 110, and second P-type well 120, regions.
Figure 7:
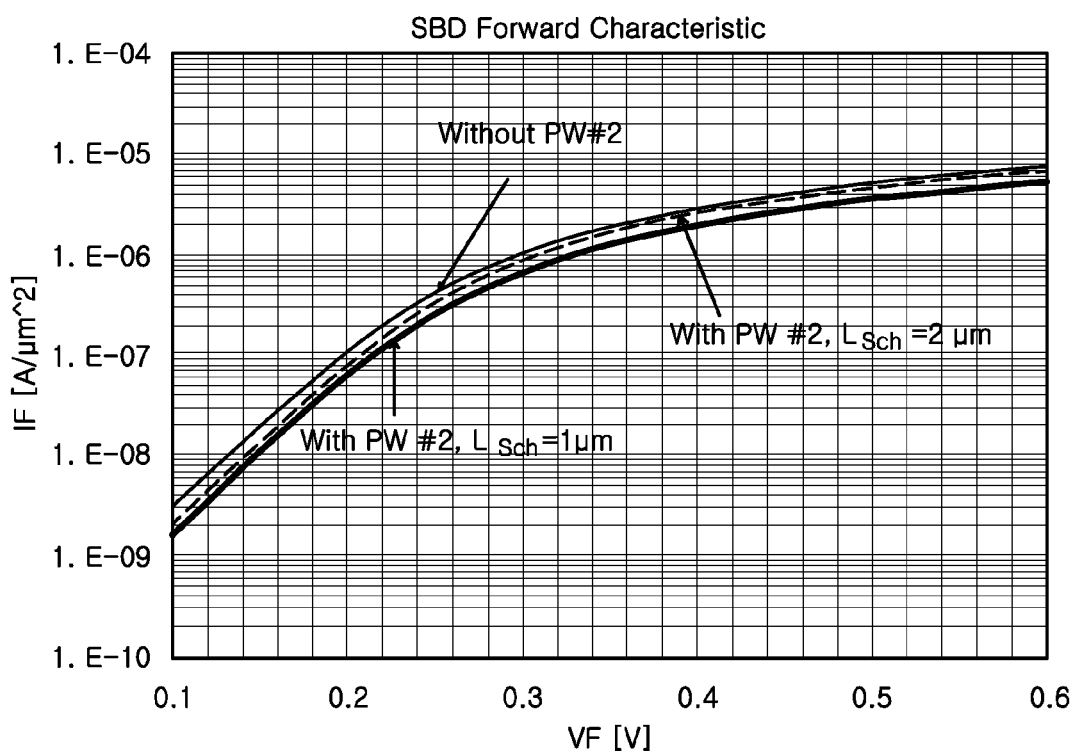

FIG. 7 is a diagram illustrating a comparison of electrical characteristics of a Schottky barrier diode according to the Schottky barrier diode of the example of FIG. 1.

As illustrated in the first graph of the example of FIG. 7, labeled as the SBD Reverse Characteristic, the second P-type well region 120 formed under an anode contact reduces the leakage current of the semiconductor device comprising a Schottky barrier diode. As a distance between the first well region 110 and the second well region 120, that is, $L_{Sch}$, decreases, the leakage current decreases. However, as illustrated in the second figure of FIG. 7, labeled as the SBD Forward Characteristic, the second P-type well region 120 formed under an anode contact reduces the forward bias current of the semiconductor device comprising a Schottky barrier diode. In such an example, the leakage current and the forward bias current are measured at a relatively high temperature, such as, for example, at about 150 degrees.

Figure 8:
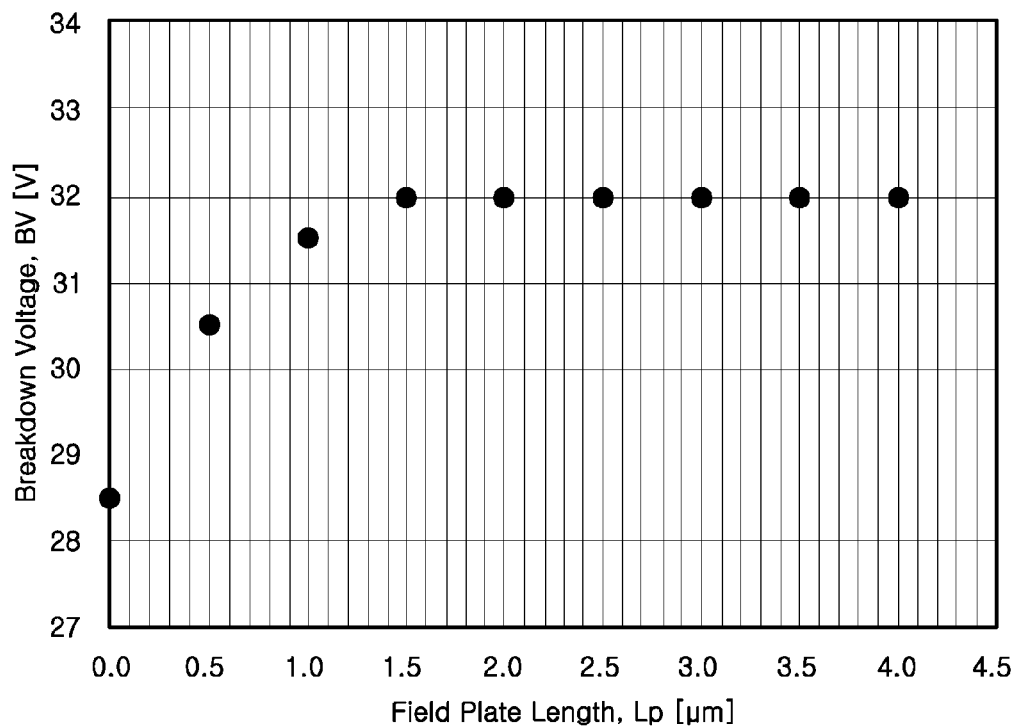
FIG. 8 shows a dependency of the breakdown voltage of the example of the semiconductor device including a Schottky barrier diode in FIG. 1 on the field plate length.
Figure 8:
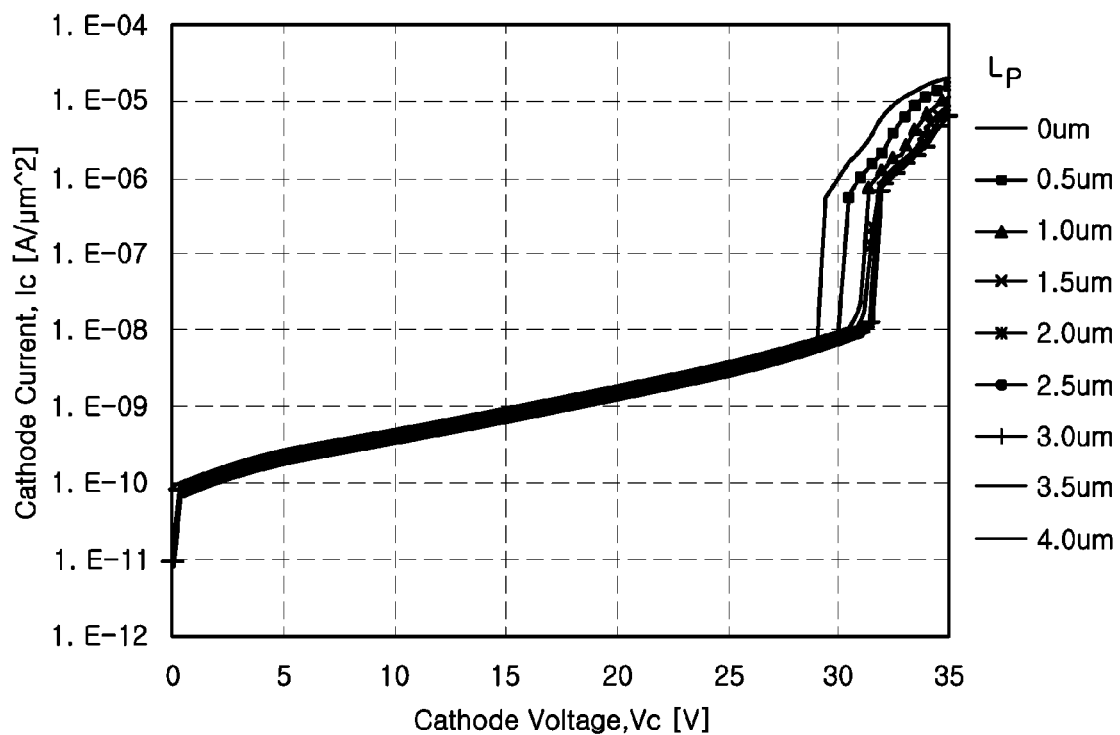

FIG. 8 is a diagram illustrating a comparison of characteristics of a breakdown voltage of a Schottky barrier according to the example of FIG. 1.

As illustrated in the first graph of the example of FIG. 8, with axes showing a relationship between Field Plate Length and Breakdown Voltage, as the length of the poly field plate 160 increases, breakdown voltage is increased and saturation occurs at a length of about 1.5 μm. Also, as illustrated in the second figure of the example of FIG. 8, with axes showing a relationship between Cathode Voltage and Cathode Current, there is no difference in a cathode current, regardless of the length of the poly field plate 160. However, the breakdown voltage has a higher value when the length of the plate 160 is higher than or equal to 1.5 μm, rather than a value with respect to when the length is less than or equal to 1.5 μm, as portrayed in the first graph.

Thus, the examples may increase breakdown voltage and reduce leakage current.

Furthermore, the examples may increase breakdown voltage and reduce leakage current by using a diffused region, located at a central position, where the ion implantation for deep well regions is not applied.

Also, examples may increase a forward bias current by providing a buried layer whose resistance is lower than the resistance of a deep well region.

In another advantageous aspect, examples may decrease lateral fields under a STI or LOCOS insulating film by a poly field plate.

Overall, examples may increase breakdown voltage by applying an epitaxial process.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device comprising:
    an N-type deep well region formed in a substrate;
    a P-type well region formed in the N-type deep well region;
    a silicide layer formed directly on the N-type deep well region, wherein a Schottky barrier diode is formed between the silicide layer and the N-type deep well region;
    an N-type buried layer formed below the N-type deep well region; and
    a deep trench isolation region in direct contact with the N-type deep well region and the N-type buried layer, respectively, having a depth larger than a depth of the N-type deep well region, and surrounding the N-type deep well region,
    wherein a horizontal length of the N-type deep well region is equal to that of the N-type buried layer.

2. The semiconductor device of claim 1, further comprising an N-type well region formed in the N-type deep well region and separated from the P-type well region by an insulating film,
    wherein a depth of the N-type buried layer is smaller than a depth of the deep trench isolation region, and
    wherein a dopant concentration of the N-type buried layer is greater than a dopant concentration of the N-type deep well region.

3. The semiconductor device of claim 1, further comprising a channel stop region formed under the deep trench isolation region.

4. The semiconductor device of claim 2, further comprising:
   a P-type highly-doped region formed in the P-type well region; and
   a field plate formed on the insulating film.

5. The semiconductor device of claim 1, further comprising an N-type diffused well region formed in the N-type deep well region,
   wherein a dopant concentration of the N-type deep well region is greater than a dopant concentration of the N-type diffused well region, and
   wherein the N-type deep well region comprises a first N-type deep well region and a second N-type deep well region spaced apart from each other by the N-type diffused well region.

6. The semiconductor device of claim 5, wherein the N-type deep well region and the N-type diffused well region are formed in an epitaxial layer that is formed in the substrate.

7. The semiconductor device of claim 2, wherein the insulating film has a depth smaller than a depth of the deep trench isolation region.

8. The semiconductor device of claim 1, further comprising a P-type deep well region formed in the substrate and separated from the N-type deep well region by the deep trench isolation region.

9. A semiconductor device comprising:
   a first deep trench and a second deep trench formed in a substrate;
   a first insulating film and a second insulating film formed in the substrate, each of the first insulating film and the second insulating film having a depth smaller than a depth of the first deep trench or the second deep trench;
   an N-type deep well region formed between the first deep trench and the second deep trench;
   an N-type buried layer formed below the N-type deep well region, a horizontal length of the N-type deep well region being equal to that of the N-type buried layer;
   a silicide layer formed directly on the N-type deep well region to form a Schottky barrier diode between the silicide layer and the N-type deep well region; and
   a first P-type well region and a second P-type well region formed in contact with the first insulating film and the second insulating film, respectively,
   wherein the first deep trench and the second deep trench each are in direct contact with the N-type deep well region and the N-type buried region, respectively.

10. The semiconductor device of claim 9, further comprising:
    a first field plate and a second field plate respectively formed on the first insulating film and the second insulating film;
    a first N-type well region formed between the first deep trench and the first insulating film; and
    a second N-type well region formed between the second deep trench and the second insulating film.

11. The semiconductor device of claim 9, further comprising an N-type diffused well region formed in the N-type deep well region,
    wherein the N-type deep well region comprises a first N-type deep well region and a second N-type deep well region spaced apart from each other by the N-type diffused well region, and
    wherein a dopant concentration of the N-type diffused well region is lower than a dopant concentration of the N-type deep well region.

12. The semiconductor device of claim 9,
    wherein a depth of the N-type buried layer is smaller than a depth of the first deep trench or the second deep trench, and
    wherein a dopant concentration of the N-type buried layer is greater than a dopant concentration of the N-type deep well region.

13. The semiconductor device of claim 9, further comprising a P-type deep well region formed in the substrate and separated from the N-type deep well region by the first deep trench or the second deep trench.

14. A semiconductor device comprising:
    an N-type deep well region formed in a substrate;
    a P-type well region formed in the N-type deep well region;
    a silicide layer formed directly on the N-type deep well region to form a Schottky barrier diode between the silicide layer and the N-type deep well region;
    an N-type buried layer formed below the N-type deep well region, a horizontal length of the N-type deep well region being equal to that of the N-type buried layer; and
    a deep trench isolation region having a depth greater than a depth of the N-type deep well region, and in direct contact with the N-type deep well region and the N-type buried layer, respectively.

15. The semiconductor device of claim 14, further comprising an N-type well region formed in the N-type deep well region and separated from the P-type well region by an insulating film,
    wherein a dopant concentration of the N-type buried layer is higher than a dopant concentration of the N-type deep well region.

16. The semiconductor device of claim 14, wherein the deep trench isolation region has a tapered shape.

17. The semiconductor device of claim 15, further comprising a field plate formed on the insulating film.

* * * * *